United States Patent
Deng et al.

[11] Patent Number: 5,815,509
[45] Date of Patent: Sep. 29, 1998

[54] METHOD AND SYSTEM FOR TESTING MEMORY

[76] Inventors: Brian Tse Deng, 1117 Windsong Trail, Richardson, Tex. 75081; Henry N. Angulo, 3829 Rolling Hills Dr., Plano, Tex. 75025; Bob Gugel, 810 O'Phelan La., Dallas, Tex. 75044

[21] Appl. No.: 934,156

[22] Filed: Sep. 19, 1997

Related U.S. Application Data

[60] Provisional application No. 60/026,971 Sep. 20, 1996.

[51] Int. Cl.$^6$ .................................................. G06F 11/00
[52] U.S. Cl. ........................................................ 371/21.2
[58] Field of Search ................................. 371/21.2, 21.1, 371/21.4, 21.6; 395/182.03, 284

[56] References Cited

U.S. PATENT DOCUMENTS

| | | | |
|---|---|---|---|
| 4,788,683 | 11/1988 | Hester et al. | 395/183 |
| 5,428,806 | 6/1995 | Pocrass | 395/284 |

*Primary Examiner*—Vincent P. Canney
*Attorney, Agent, or Firm*—W. James Brady, III; Richard L. Donaldson

[57] ABSTRACT

The invention comprises a method and system for testing memory in an interface system 10 coupling a parallel host bus 30 to a serial bus 20. The system comprises a random access memory 70 having a plurality of memory locations for temporarily storing data received from either the parallel host bus 30 or the IEEE 1394 serial bus 20, the random access memory 70 being logically divided into a transmit memory portion and a receive memory portion. The interface also comprises a transmission control unit 40 operable to control transmission of data from the parallel host bus 30 to the IEEE 1394 serial bus 20. The transmission control unit 40 is further operable to access the transmit memory portion of the random access memory 70. The interface also comprises a reception control unit 50 operable to control reception of data by the parallel bus 30 from the serial bus 20. The receive control unit 50 is further operable to access the receive memory portion of the random access memory 70. The interface further comprises a test unit 60 operable to selectively obtain control of the random access memory 70 based on a control signal received from the parallel host bus 30; internally generate addresses for each memory location within the random access memory 70; control transmission of parallel data from each memory location associated with the internally generated addresses to the parallel host bus 30 for inspection; and selectively relinquish control of the random access memory 70 to allow transmission of data between the IEEE 1394 serial bus 20 and the parallel host bus 30.

20 Claims, 4 Drawing Sheets

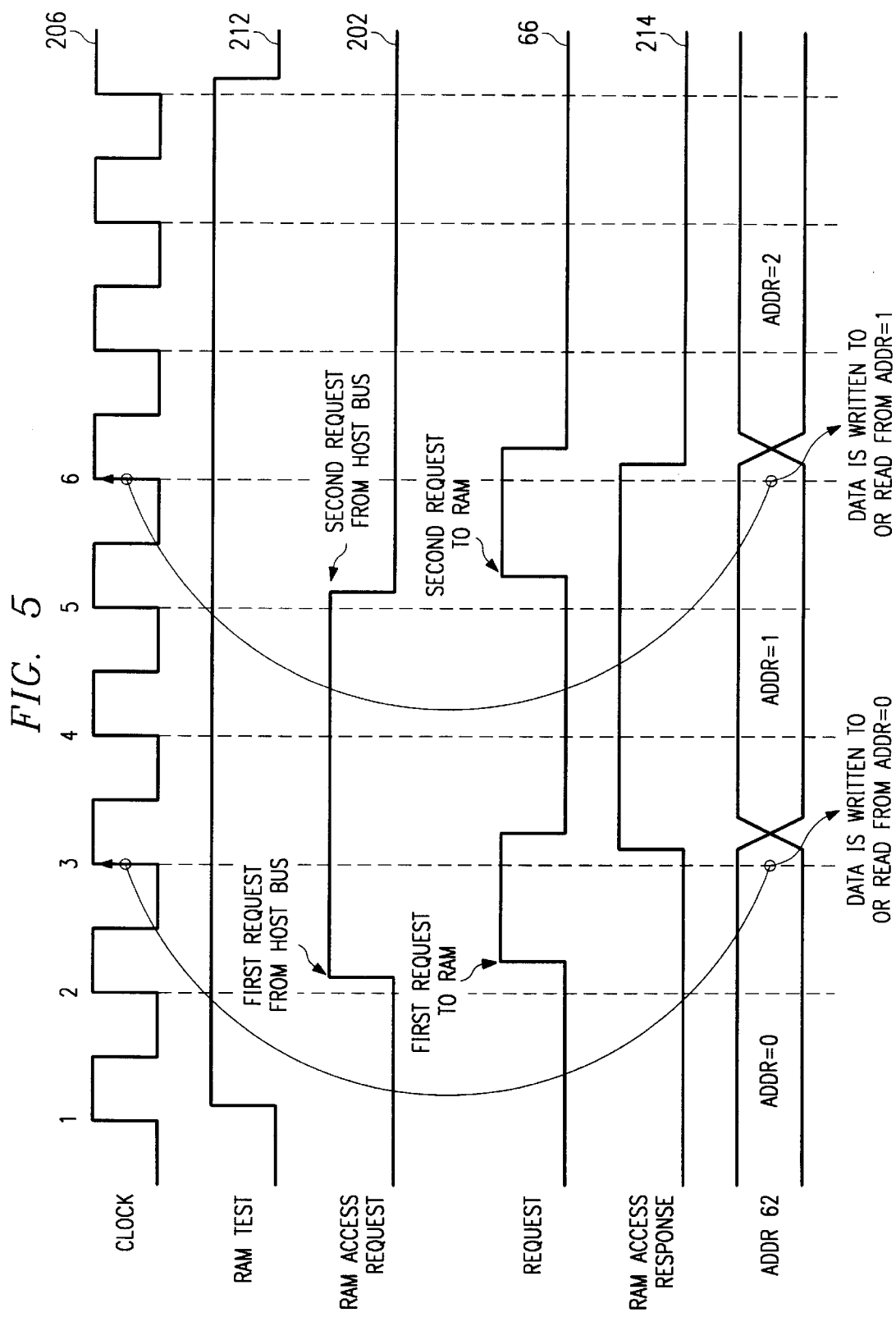

METHOD AND SYSTEM FOR TESTING MEMORY

TECHNICAL FIELD OF THE INVENTION

This invention relates generally to the field of semiconductor devices and more particularly to a method and system for testing memory.

BACKGROUND OF THE INVENTION

Single port clocked RAM is conventionally used as first-in, first-out (FIFO) memory in an interface between an IEEE 1394 serial bus and a parallel host bus. The RAM is used to temporarily store data for transmission to the IEEE 1394 serial bus or for reception by the parallel host bus. The RAM is logically divided into transmit FIFO RAM and receive FIFO RAM. Transmit FIFO RAM temporarily stores data provided by the parallel host bus for transmission to the IEEE 1394 serial bus. Receive FIFO RAM temporarily stores data provided by the IEEE 1394 serial bus for transmission to the parallel host bus.

Fully testing the RAM used in an interface between an IEEE 1394 serial bus and a parallel host bus is difficult. In a conventional interface between an IEEE 1394 serial bus and a parallel host bus, specific locations in the RAM are not addressed by either the IEEE 1394 serial bus or the host bus. Rather, the RAM is used as first-in, first-out memory, with data written to or read from the next available location in RAM. Thus, conventionally, specific locations in the RAM may not be read from or written to in order to test the memory. Additionally, because the FIFO RAM used in an interface between an IEEE 1394 serial bus and a parallel host bus is logically divided into transmit FIFO RAM and receive FIFO RAM, only a portion of the entire RAM may be accessed though either the host bus or the IEEE 1394 serial bus. The parallel host bus may provide data only to the transmit FIFO RAM and receive data only from the receive FIFO RAM. The IEEE 1394 serial bus may provide data only to the receive FIFO RAM and receive data only from the transmit FIFO RAM. Thus, even if specific locations in the RAM could be addressed through either the parallel host bus or the IEEE 1394 serial bus, reading from and writing to each memory location would require reading and writing data through both the IEEE 1394 serial bus and the parallel host bus. In addition, parallel to serial and serial to parallel conversions would be necessary. Parallel to serial and serial to parallel conversions increase the time required to fully test the RAM.

Conventional IEEE 1394 specifications provide that any packet of data must contain a header cycle redundancy check (CRC). The RAM in an interface between an IEEE 1394 serial bus and a parallel host bus is conventionally tested through the use of such a header cycle redundancy check. Typically, when data is transmitted between the IEEE 1394 serial bus and the parallel host bus, information is also transmitted with it that allows the RAM to generate an expected header CRC. This expected header CRC is compared to the transmitted header CRC. If the transmitted header CRC and the expected header CRC do not match, corresponding to an error condition, the parallel host bus is not allowed to read the data.

The use of CRCs to assess the integrity of RAM in an interface between an IEEE 1394 serial bus and a host parallel bus suffers several disadvantages. Because a specific IEEE 1394 format for a data packet must be followed, all bits in the RAM are not necessarily toggled. Toggling all bits in the RAM is generally required to fully assess the integrity of the entire RAM. Additionally, with the parallel bus unable to read the data, it is difficult to determine the cause of any error for debugging purposes. Typically, all that can be determined is that the header CRCs do not match. Furthermore, the transmission of data between the IEEE 1394 serial bus and the parallel bus requires serial to parallel and parallel to serial conversions. Incurring these conversions increases the time required for testing.

Other methods for testing internal RAM, which allow direct reading of the contents of the RAM, include a scan chain and a parallel module test (PMT). A scan chain transmits data to and from the memory in serial fashion. With a PMT, data is transferred to and from the memory in parallel fashion.

A scan chain test requires several external signals, such as scan in, scan out, test mode control signals, and a scan clock. It shifts all required addresses, input data, and chip control signals into internal RAM in a serial fashion. The use of a scan chain test may not be appropriate for testing RAM used in an interface between an IEEE 1394 serial bus and a parallel bus. For example, because data is transmitted in serial form, testing in slow. In addition, not all memory locations in the RAM may be addressed from the parallel host bus due to the logical division of the RAM into transmit FIFO RAM and receive FIFO RAM. Furthermore, particular addresses within the RAM may not be specified by an external source over either the host bus or the IEEE 1394 serial bus. Rather, the interface allows writing and reading from the RAM only on a first-in, first-out basis.

With the PMT form of testing RAM, all internal RAM signals are connected to external input/output pins with multiplex logic. During testing, the input/output pins are redefined. The test is performed in parallel fashion by directly accessing RAM signals from input/output pins. If the internal RAM has more signals than available input/output pins, the PMT cannot be used. For example, a typical 512×32 clocked SRAM has 9 bits of address, 32 bits of data input, 32 bits of data output, 3 control lines, and one clock, which requires 77 input/output pins. Additionally, PMT can generally only be used during manufacture. It is not practical for end users to use PMT to test RAM in their application because the input/output pin definition cannot be redefined after manufacture. Thus, end users cannot use PMT to test the RAM while powering up devices utilizing the interface between an IEEE 1394 serial bus and a parallel host bus.

SUMMARY OF THE INVENTION

Therefore, a need has arisen for a method and system for testing memory that substantially eliminates or reduces disadvantages and problems associated with prior devices and method.

The invention comprises a method and system for testing memory in an interface system coupling a parallel host bus to a serial bus. The method comprises receiving within the interface system a test control signal from the host bus and selectively obtaining control of memory based on the control signal. The method further comprises receiving a plurality of parallel data values from the parallel host bus and generating internally within the interface a write address for each parallel data value. Each parallel data value is written to a location in the memory associated with the write address associated with the parallel data value. Each parallel data is read from the memory for comparison to the parallel data value written to verify the proper operation of the memory. The method further comprises selectively relinquishing control of the memory. The memory is selectively accessed for testing while the interface is coupled to both the parallel host bus and the serial bus and control of the memory is selectively relinquished to allow transmission of data between the host bus and the serial bus.

According to another embodiment of the invention, a parallel to serial interface for connecting a parallel host bus to an IEEE 1394 serial bus comprises a random access memory having a plurality of memory locations for temporarily storing data received from either the parallel host bus or the IEEE 1394 serial bus, the random access memory being logically divided into a transmit memory portion and a receive memory portion. The interface also comprises a transmission control unit operable to control transmission of data from the parallel host bus to the serial bus, the transmission control unit further operable to access the transmit memory portion of the random access memory. The interface also comprises a reception control unit operable to control reception of data by the parallel bus from the IEEE 1394 serial bus, the receive control unit further operable to access the receive memory portion of the random access memory. The interface further comprises a test unit operable to selectively obtain control of the random access memory based on a control signal received from the parallel host bus; internally generate addresses for each memory location within the random access memory; control transmission of parallel data from each memory location associated with the internally generated addresses to the parallel host bus for inspection; and selectively relinquish control of the random access memory to allow transmission of data between the serial bus and the parallel bus.

The invention provides various technical advantages. For example, one technical advantage is that memory may be directly read without increasing the number of input/output pins required of the interface and without redefining the input/output pins for testing purposes. Another technical advantage is that the invention provides a method for rapidly testing memory because data is both written and read in parallel fashion. Another technical advantage is that end users can perform a memory test by directly writing to and reading from each location in the memory, thus allowing a complete verification of the RAM. Another technical advantage is that end users can perform a memory test during powering up of a device incorporating the memory.

BRIEF DESCRIPTION OF THE DRAWINGS

For a more complete understanding of the present invention and the advantages thereof, reference is now made to the following descriptions taken in connection with the accompanying drawings in which:

FIG. 5 is a timing diagram associated with a portion of the RAM test control unit illustrated in FIG. 4.

DETAILED DESCRIPTION OF THE INVENTION

An embodiment of the present invention and its advantages are best understood by referring to FIGS. 1 through 5 of the drawings, like numerals being used for like and corresponding parts of the various drawings.

Figure 1:
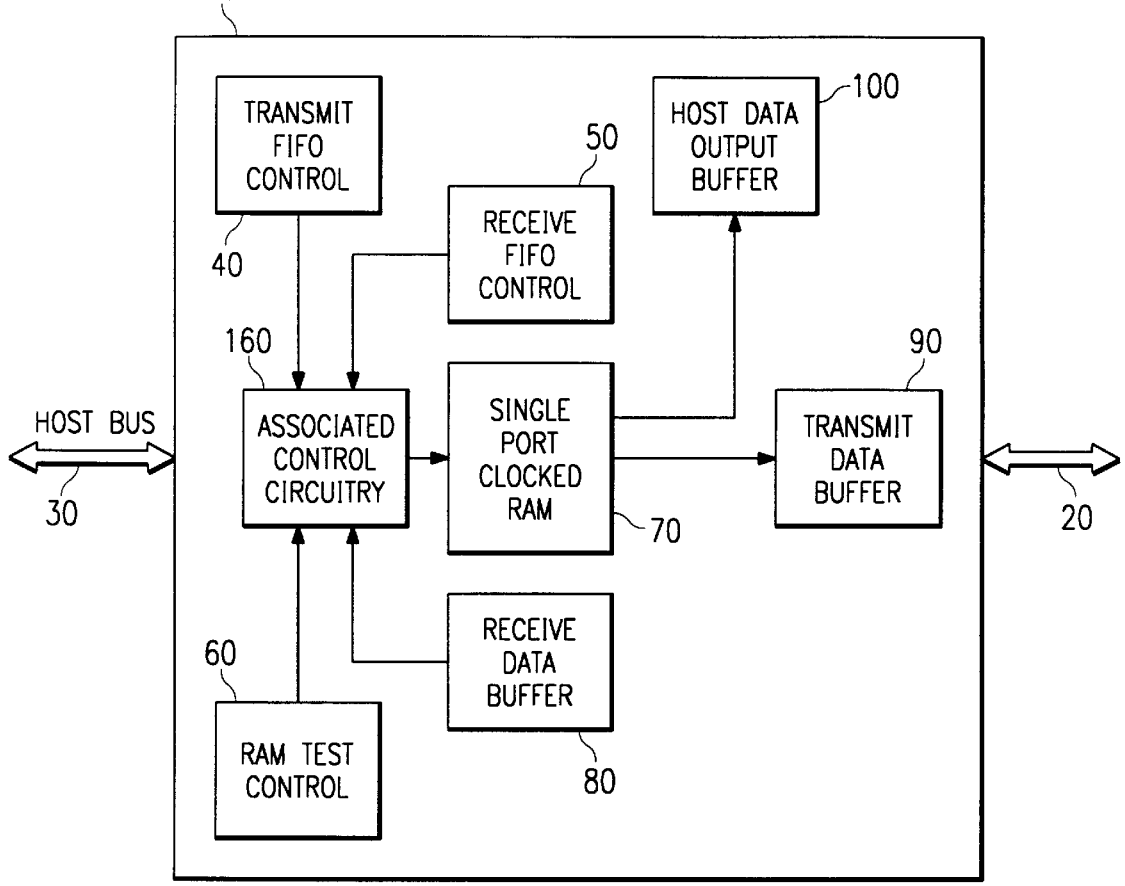
FIG. 1 illustrates an example parallel to serial interface in block diagram form constructed in accordance with the invention.

FIG. 1 illustrates in block diagram form an example interface 10 according to the teachings of the invention. Interface 10 coordinates the transmission and reception of data between an IEEE 1394 serial bus 20 and a parallel host bus 30. Interface 10 may be formed using a single integrated circuit.

Parallel host bus 30 provides and receives data and control signals in parallel form. IEEE 1394 serial bus 20 provides and receives data and control signals according to IEEE 1394 specifications in serial form. The interface 10 comprises a single port clocked RAM 70 for temporarily storing data received from either the IEEE 1394 serial bus 20 or the parallel host bus 30. Single port clocked RAM 70 is logically divided into transmit first-in, first-out (FIFO) memory, for temporarily storing data being transmitted from the parallel host bus 30 to the IEEE 1394 serial bus 20, and receive FIFO memory, for temporarily storing data being received by the parallel host bus 30 from the IEEE 1394 serial bus 20. The transmit FIFO memory may be accessed through transmit FIFO control unit 40. The receive FIFO memory may be accessed though receive FIFO control unit 50.

Transmit FIFO control unit 40 provides control logic to control transmission of data that is provided from the parallel host bus 30 to the single port clocked RAM 70. Transmit FIFO control unit 40 may also control movement of data stored in single port clocked RAM 70 through transmit data buffer 90 to IEEE 1394 serial bus 20. In one embodiment, transmit data buffer 90 receives 32 bit data in parallel fashion from single port clocked RAM 70 and transmits it in serial fashion to IEEE 1394 serial bus 20.

The receive FIFO control unit 50 controls data transmitted from IEEE 1394 serial bus 20 through the receive data buffer 80 into single port clocked RAM 70. In one embodiment, the receive data buffer 80 receives serial data from the serial bus 20 and transmits the data in parallel fashion when the receive data buffer 80 is full. In the same embodiment, the receive data buffer 80 is full when it contains 32 bits of data. Host data output buffer 100 receives parallel data from the single port clocked RAM 70 and transmits the data in a parallel fashion to the parallel host bus 30. Associated control circuitry 160 comprises additional circuitry used in interface 10.

RAM test control unit 60 operates to verify and test memory in an interface, such as interface 10. RAM test control unit 60 is operable to obtain control of single port clocked RAM 70, control the reading and writing of data to all memory locations of single port clocked RAM 70, and internally generate addresses for specifying locations for writing or reading data provided from parallel host bus 30. When the RAM test control unit 60 obtains control of single port clocked RAM 70, transmit FIFO control unit 40 and receive FIFO control unit 50 are disabled. With transmit FIFO control unit 40 and receive FIFO control unit 50 disabled, data may be provided by parallel host bus 30 to all locations within single port clocked RAM 70, and data may be received by parallel host bus 30 from all locations within single port clocked RAM 70. RAM test control unit 60 generates internally addresses for specifying locations for writing or reading data in single port clocked RAM 70. Because the addresses are generated internally within the interface 10, data may be written to and read from specific locations within single port clocked RAM 70. Because data may be written to and read from specific locations in single port clocked RAM 70, values of data written to a particular location in the single port clocked RAM 70 may be compared to values of the data read from the same location in the single port clocked RAM 70. Comparing the values of data written to and read from the same location in single port clocked RAM 70 allows the integrity of the single port clocked RAM 70 to be assessed. Because data may be written from or received by parallel host bus 30 in parallel fashion, rapid testing may occur.

The writing of data to and reading of data from specific locations within single port clocked RAM 70 differs from conventional usage and testing of interfaces between IEEE 1394 serial bus and a parallel host bus. For example, conventional interfaces between an IEEE 1394 serial bus and a parallel host bus do not comprise a method for transmitting an address from either a parallel host bus or the IEEE 1394 serial bus to the RAM. Rather, because the RAM is merely used to temporarily store data transmitted between a parallel host bus and an IEEE 1394 serial bus, conventionally data is written by one bus and read by the other bus in a first-in, first-out fashion. Therefore, conventionally, particular locations in memory are not specified for reading or writing data, and thus, no pins on the interface are allocated for receiving an address. Because particular locations in memory cannot be specified, values of data written to a particular location in the memory may not be compared to values of the data read from the same location. Therefore, conventionally, the integrity of memory in an interface between an IEEE 1394 serial bus and a parallel host bus cannot be fully tested.

Figure 2:
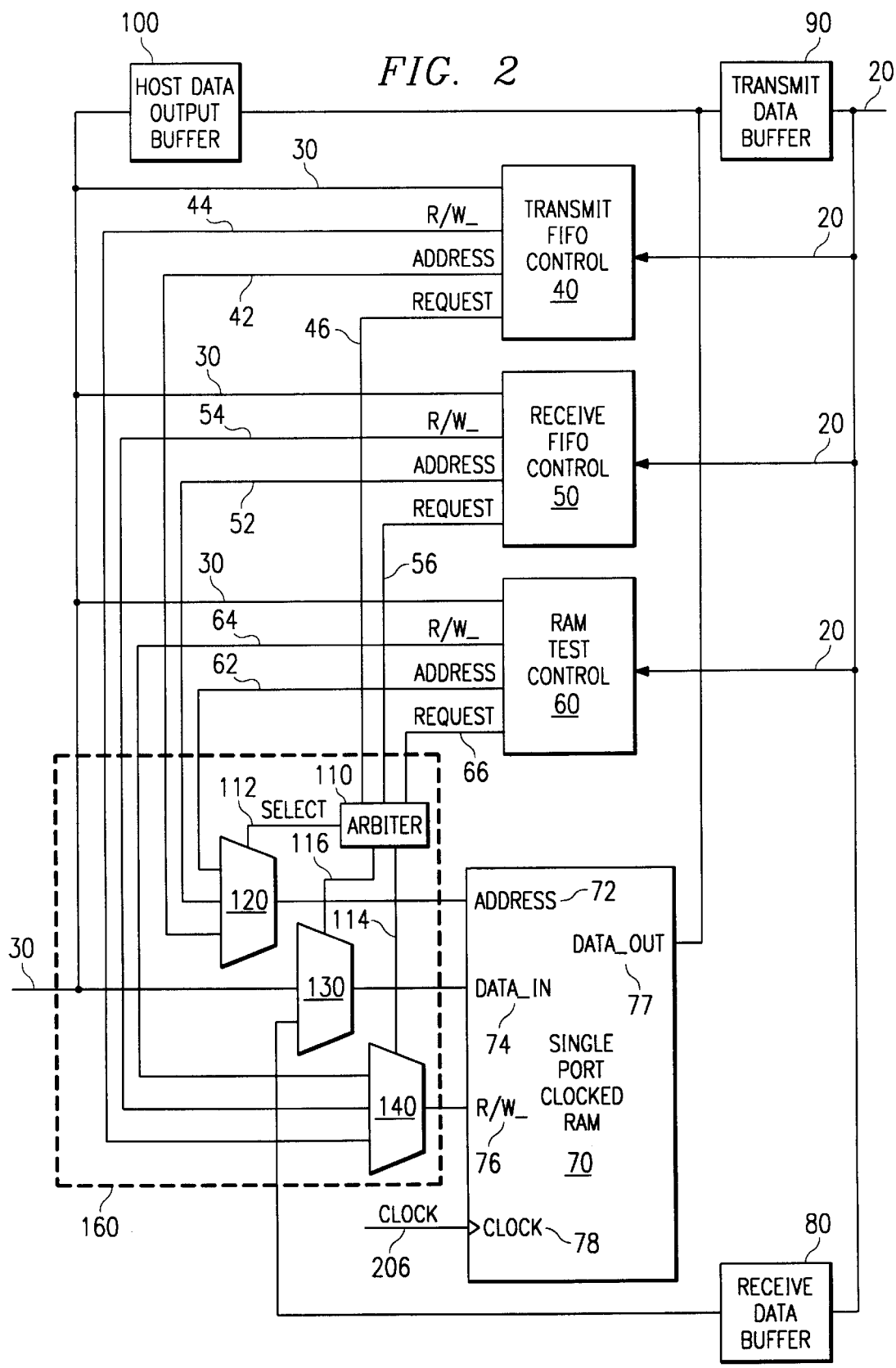
FIG. 2 is a block diagram that illustrates additional details of the interface shown in FIG. 1, showing more completely the connections between the sub-units of the interface.

In FIG. 2, additional details of an exemplary embodiment of interface 10 are shown. Single port clocked RAM 70 includes an address input port 72 for receiving a memory location to be used in the storage or retrieval of data. As will be discussed in more detail below, address input port 72 receives a signal from either transmit FIFO control unit 40, receive FIFO control unit 50, or RAM test control unit 60. Single port clocked RAM 70 also includes a data input port 74 for receiving data from either the parallel host bus 30 or from the IEEE 1394 serial bus 20. Read-write input port 76 of single port clocked RAM 70 determines whether single port clocked RAM 70 reads or writes data. The read-write input port 76 is also controlled by either transmit FIFO control unit 40, receive FIFO control unit 50, or RAM test control unit 60. Data output port 77 of single port clocked RAM 70 provides data from the memory location specified to single port clocked RAM 70 at address input port 72 to either the IEEE 1394 serial bus 20 or parallel host bus 30. This data first passes through either transmit data buffer 90 or host data buffer 100. Single port clocked RAM 70 also comprises a clock input 78 for receiving a clock signal 206 from a system clock (not explicitly shown).

Data input port 74 includes 32 inputs for receiving 32 bit parallel data; however, any other suitable number of inputs could be used. Data output port 77 provides data in 32 bit parallel form to transmit buffer 90. Transmit buffer 90 transmits the parallel data in serial fashion to IEEE 1394 bus 20. Data output port 77 also provides 32 bit parallel data to host data output buffer 100. Host data output buffer 100 transmits data in parallel to host bus 30. Data input port 74 receives data originating from either parallel host bus 30 or IEEE 1394 serial bus 20. If data is received from IEEE 1394 serial bus 20, it is first passed through receive data buffer 80 and then provided in parallel form to data input port 74.

The transmission of parallel data from parallel host bus 30 to IEEE 1394 serial bus 20 is controlled by transmit FIFO control unit 40. Transmit FIFO control unit 40 controls the transmission of parallel data from the parallel host bus 30 to the data input port 74 of single port clocked RAM 70. Transmit FIFO control unit 40 additionally controls the writing of data stored in single port clocked RAM 70 from data output port 77 to transmit data buffer 90. Transmit FIFO control unit 40 generates an address output signal 42, a read-write output signal 44, and a request output signal 46. These output signals are generated by the transmit FIFO control unit 40 through conventional techniques based on control signals provided by the parallel host bus 30 and IEEE 1394 serial bus 20. The address output signal 42 specifies addresses within the transmit FIFO portion of single port clocked RAM 70 on a first-in, first-out basis. Thus, transmit FIFO control unit 40 produces an address output signal 42 specifying the address of next available memory location within the transmit FIFO portion of single port clocked RAM 70.

Address output signal 42 of transmit FIFO control unit 40 is provided to multiplexer 120. The output of multiplexer 120 provides an address to address input port 72 of single port clocked RAM 70. The read-write output signal 44 of transmit FIFO control unit 40 is provided to multiplexer 140. The output of multiplexer 140 is provided to read-write input port 76 of single port clocked RAM 70 to specify whether data will be read from or written to single port clocked RAM 70. Request output signal 46 is provided to arbiter 110. When active, request output signal 46 requests that the transmit FIFO control unit 40 be granted control of single port clocked RAM 70. Arbiter 110 determines whether transmit FIFO control unit 40 is granted control of single port clocked RAM 70. Arbiter 110 is discussed in greater detail below.

The receive FIFO control unit 50 controls the reception of data from IEEE 1394 serial bus 20 by single port clocked RAM 70 and further controls the reading of data from single port clocked RAM 70 for reception by parallel host bus 30. Receive FIFO control unit 50 operates in a substantially similar manner to transmit FIFO control unit 40. Receive FIFO control unit 50 includes an address output signal 52, a read-write output signal 54, and a request output signal 56. These output signals are generated by the receive FIFO control unit 50 through conventional techniques based on control signals provided by the parallel host bus 30 and IEEE 1394 serial bus 20. The address output signal 52 specifies addresses within the receive FIFO portion of single port clocked RAM 70 on a first in, first-out basis. Thus, receive FIFO control unit 50 produces an address output signal 52 specifying the address of the next available memory location in the receive FIFO portion of single port clocked RAM 70.

Address output signal 52 of receive FIFO control unit 50 is provided to multiplexer 120. The output of multiplexer 120 provides an address to address input port 72 of single port clocked RAM 70. The read-write output signal 54 of receive FIFO control unit 50 is provided to multiplexer 140. The output of multiplexer 140 is provided to read-write input 76 of single port clocked RAM 70 to specify whether data will be read from or written to single port clocked RAM 70. Request output signal 56 is provided to arbiter 110. Request output signal 56 requests that the receive FIFO control unit 50 be granted control of single port clocked RAM 70. Arbiter 110 determines whether receive FIFO control unit 40 is granted control of single port clocked RAM 70. Arbiter 110 is discussed in greater detail below.

RAM test control unit 60 controls reading from and writing to single port clocked RAM 70 while testing the memory of single port clocked RAM 70. RAM test control unit 60 generates an address output signal 62 for specifying an address in single port clocked RAM 70 for reading or writing data. Address output signal 62 is received by multiplexer 120. The output of multiplexer 120 is provided to address input port 72. RAM test control 60 also generates a read-write output signal 64 for specifying whether data will be read from or written to RAM 70. Read-write output signal 64 is received by multiplexer 140. The output of multiplexer 140 is provided to read-write input port 76 of single port clocked RAM 70. RAM test control unit 60 also generates a request output signal 66. Request output signal 66 communicates a request from RAM test control unit 60 to arbiter 110 for control of single port clocked RAM 70.

Arbiter 110 may comprise a conventional priority encoder and operates to control and prioritize requests to control the single port clocked RAM 70. Requests are communicated by request signals 46, 56, and 66 of transmit FIFO control unit 40, receive FIFO control unit 50, and RAM test control unit 60, respectively. Arbiter 110 processes requests from RAM test control unit 60 first, receive FIFO control unit 50 second, and transmit FIFO control unit 40 last. Thus, if transmit FIFO control unit 40, receive FIFO control unit 50, and RAM test control unit 60 all request control of single port clocked RAM 70 during the same clock cycle, control will be granted to single port clocked RAM 60. If control is requested by receive FIFO control unit 50 and transmit FIFO control unit 40 during the same clock cycle, control will be granted to receive FIFO control unit 50.

Arbiter 110 comprises three output signals 112, 114, and 116. Each of the arbiter outputs 112, 114, and 116 is a selector for a multiplexer. The select address output signal 112 is provided to multiplexer 120. Multiplexer 120 selects an address signal from either transmit FIFO control unit 40, receive FIFO control unit 50, or RAM test control unit 60. The select read-write output signal 114 is provided to multiplexer 140. Multiplexer 140 selects a read-write signal from either transmit FIFO control unit 40, receive FIFO control unit 50, or RAM test control unit 60. The select data output signal 116 is provided to multiplexer 130. Multiplexer 130 selects whether data is received from the parallel host bus 30 or the IEEE 1394 serial bus 20. If either RAM test control unit 60 or transmit FIFO control unit 40 requests control of single port clocked RAM 70, the arbiter 110 selects data provided by parallel host bus 30 for reception by data input port 74. If receive FIFO control unit 50 requests control of single port clocked RAM 70, the arbiter 110 selects data from the IEEE 1394 serial bus 20 for reception by data input port 74.

Thus, the RAM test control unit 60 may obtain control of single port clocked RAM 70 by sending a request signal to arbiter 110. Because RAM test control unit 60 may obtain control of single port clocked RAM 70, data may be written to and read from locations in the single port clocked RAM 70 specified by the RAM test control unit 60. In contrast to receive FIFO control unit 50 and transmit FIFO control unit 40, RAM test control unit 60 is not limited to controlling access to memory locations in only a portion of single port clocked RAM 70, such as the receive FIFO portion of single port clocked RAM 70 or the transmit FIFO portion of single port clocked RAM 70. RAM test control unit 60 may control writing to and reading from any location in single port clocked RAM 70. Because RAM test control unit 60 may write to and read from any location in single port clocked RAM 70, the integrity of the entire single port clocked RAM 70 may be verified.

Figure 3:
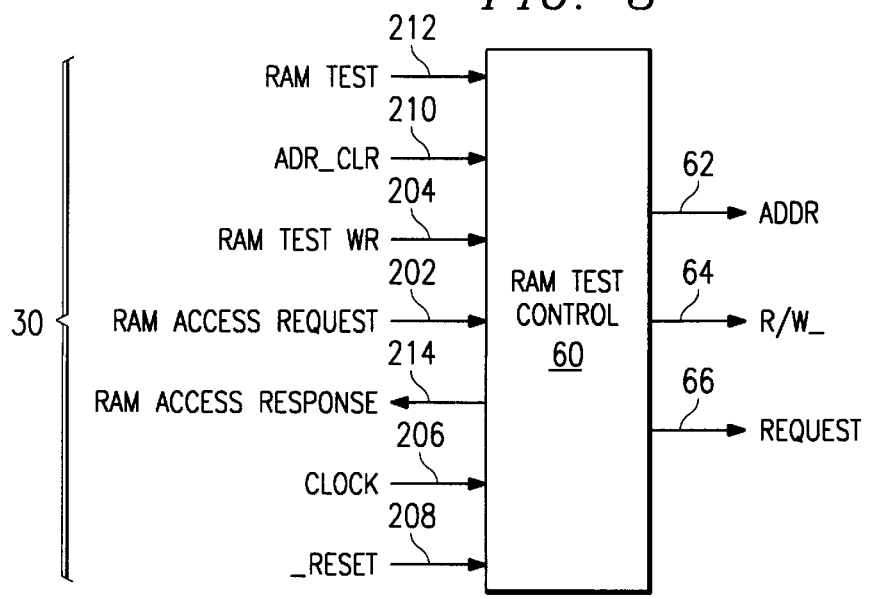
FIG. 3 is a block diagram that illustrates the inputs and outputs of the example RAM test control unit shown in FIGS. 1 and 2.

In FIG. 3, the input and output signals of RAM test control unit 60 are illustrated. The input and output signals of RAM test control unit 60 are used to communicate information used by the RAM test control unit 60 to initiate and complete a test of single port clocked RAM 70. RAM test control unit 60 produces an address output signal 62 to specify a location in single port clocked RAM 70 for reading or writing data. RAM test control unit 60 also produces a read-write signal 64 for specifying whether data will be read from or written to single port clocked RAM 70. In the embodiment shown in FIGS. 1 through 5, read-write signal 64 is set low when writing to single port clocked RAM 70 and is set high when reading from single port clocked RAM 70. RAM test control unit 60 also produces a request signal 66. Request signal 66 is provided to the arbiter 110 to communicate a request for control of single port clocked RAM 70.

Single port clocked RAM 70 receives a variety of control signals from the parallel host bus 30. For the embodiment of interface 10, some of these signals may be received indirectly from the parallel host bus 30 through a register on interface 10 through conventional techniques to avoid the need for adding pins to interface 10. A RAM test signal 212 communicates to RAM test control unit 60 a request for a test of single port clocked RAM 70. The RAM test signal 212 may be set high when a memory test is desired. A clear address signal 210 is also provided to RAM test control unit 60 by the parallel host bus 30. In one embodiment, when the clear address signal 210 is high, an address counter within RAM test control unit 60 is set to zero. A RAM action signal 204 is received by RAM test control unit 60 from the parallel host bus 30. RAM action signal 204 may be set low when a write is requested and high when a read is requested. A RAM access request signal 202 is provided by the parallel host bus 30 and received by RAM test control unit 60. In one embodiment, RAM access request signal 202 is toggled in order to access the single port clocked RAM 70 for testing purposes. For example, for a first access, RAM access request signal 202 is set high. For a second access, RAM access request signal 202 is set low. RAM test control unit 60 also receives a system clock signal 206 and a reset signal 208. When reset signal 208 is set low, internal flip-flops within RAM test control unit 60 are initialized to zero, as discussed in greater detail below. Because an interface between a parallel host bus and an IEEE 1394 serial bus conventionally does not receive addresses specifying particular locations within the RAM to temporarily store data being transmitted between the parallel host bus and the IEEE 1394 serial bus, input pins are not available on the interface for receiving an address specifying a particular location within the RAM. Therefore, parallel host bus 30 cannot provide a particular address specifying a location within single port clocked RAM 70 for writing data to or reading data from. Rather, in order to write and read data from specific locations in single port clocked RAM 70, RAM test control unit 60 internally generates an address output signal 62 for specifying particular locations within single port clocked RAM for reading data from or writing data to. The internal generation of addresses specifying particular locations in memory is discussed in greater detail in conjunction with FIG. 4.

Figure 4:
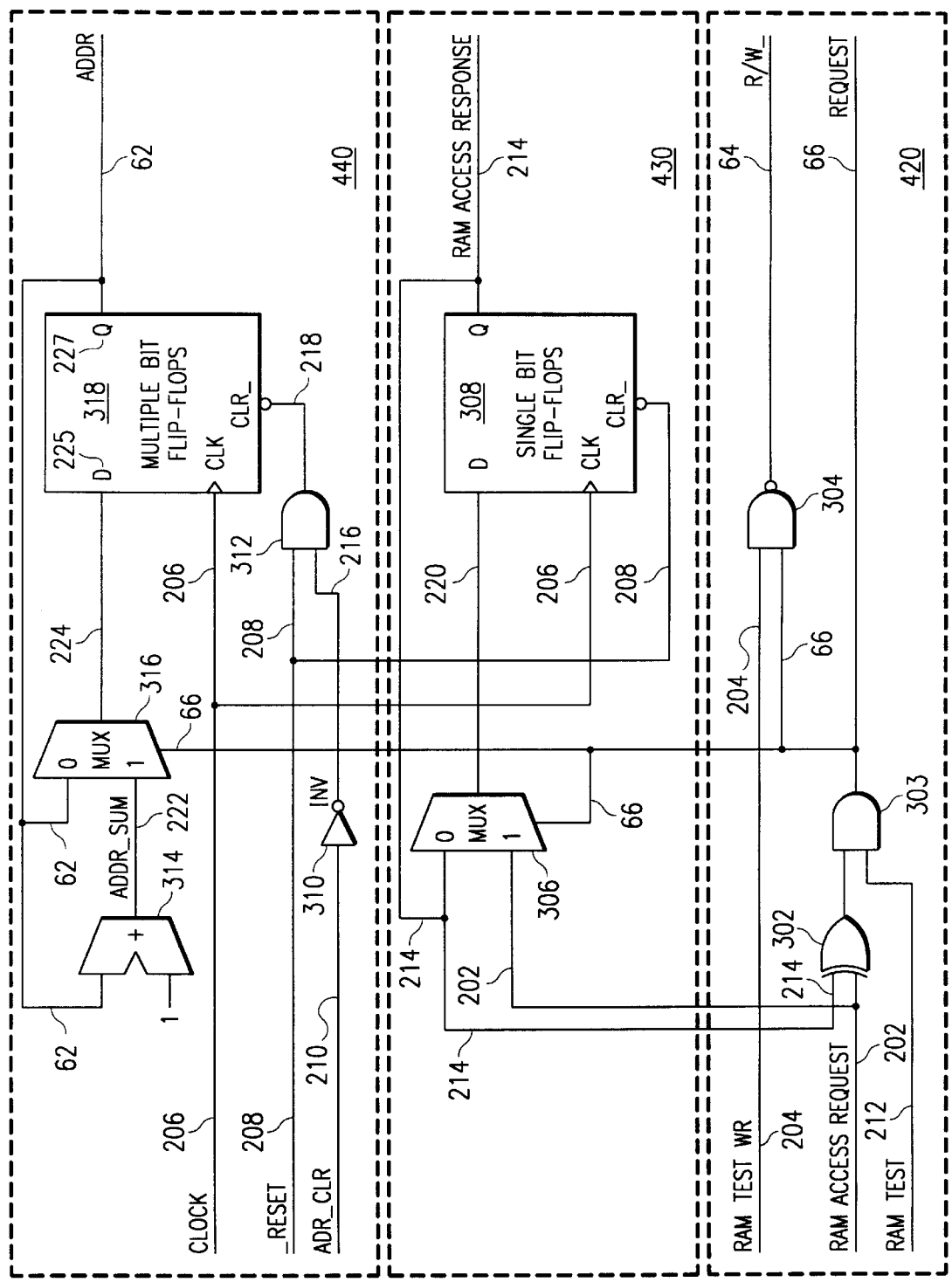
FIG. 4 is a block diagram that illustrates additional details of the RAM test control unit shown in FIG. 3.

Referring now to FIG. 4, an exemplary embodiment of the RAM test control unit 60 is shown. According to the embodiment shown in FIG. 4, the RAM test control unit 60 comprises a read-write circuit 420, a handshaking circuit 430, and an internal addressing circuit 440. Read-write circuit 420, handshaking circuit 430, and internal addressing circuit 440 operate to verify and test memory in an interface, such as interface 10. Read write circuit 420 operates in conjunction with handshaking circuit 430 to obtain control of the single port clocked RAM 70 and control reading data from and writing data to all locations of single port clocked RAM 60. Internal addressing circuit 440 provides addresses for specifying particular locations within single port clocked RAM 60 to write to or read from. Through reading data from and writing data to all locations in single port clocked RAM 70, single port clocked RAM 70 may be tested by comparing the values of the data written to the values of the data read.

To specify particular locations within single port clocked RAM 60 to write to or read from, the internal addressing circuit 440 uses a multiple bit flip-flop 318 for latching an address signal 224. Multiple bit flip-flop 318 produces address output signal 62 for specifying a location in single port clocked RAM 70 for writing or receiving data. Multiple bit flip-flop 318 receives address signal 224 at input 225 and copies address signal 224 to the address output signal 62 at output 227 after the rising edge of clock input signal 206. Clock input signal 206 is received from a system clock. Address signal 224 and address output signal 62 may contain multiple bits.

New values of address signal 224 and address output signal 62 are generated based on a previous value of address output signal 62. This function is performed by multiplexer 316 and incrementer 314. If request signal 66 is high, the output of the incrementer 314 is provided by multiplexer 316 as address signal 224 for the next clock cycle. If request signal 66 is low, the previous value of address output signal 62 and address signal 224 are retained during the next clock cycle. The characteristics of request signal 66 will be discussed in more detail below. In the embodiment shown in FIG. 4, incrementer 314 adds one to the value of its input. The input to incrementer 314 is address output signal 62. Thus, through the use of incrementer 314, multiplexer 316, and multiple bit flip-flop 318, an address output signal 62 can be provided for reading data from or writing data to sequential locations in memory. Because the addresses are generated internally within the interface, memory, such as single port clocked RAM 70, may be tested without receiving addresses externally from either the parallel host bus 30 or IEEE 1394 serial bus, which would require additional pins. Additionally, because test control unit 60 is operable to obtain control of single port clocked RAM 70, all locations of single port clocked RAM may be accessed rather than only a portion. Transmit FIFO control unit 40 and receive FIFO control unit 50 each can only access a portion of single port clocked RAM 60.

In order to reset address output signal 62 to zero, the multiple bit flip-flop 318 receives a clear input signal 218. Clear input signal 218 is received from AND gate 312. The AND gate 312 receives as inputs a reset signal 208 and the complement of address clear signal 210 provided by inverter 310. Multiple bit flip-flop 318 resets when clear input signal 218 is low. Thus, multiple bit flip-flop 318 will reset when reset 208 is low or when address clear signal 210 is high.

The characteristics of request signal 66 is controlled in part by read-write circuit 420. Read-write circuit 420 receives a RAM test signal 212. When RAM test signal 212 is low, RAM test control unit 60 does not request control of single port clocked RAM 70. If RAM test signal 212 is high, control of single port clocked RAM 70 is requested, and the status of request signal 66 is determined by RAM access request signal 202 and RAM access response signal 214. RAM access request signal 202 and RAM access response signal 214 are inputs to EXCLUSIVE-OR gate 302. In the case that RAM test signal 212 is high, if RAM access request signal 202 and RAM access response signal 214 are either both high or both low, request signal 66 will be low. However, if either RAM access request signal 202 or RAM access response signal 214 are low while the other is high, request signal 66 will be high. The characteristics of RAM access response signal 214 will be described below.

RAM access response signal 214 is controlled by handshaking circuit 430. The handshaking circuit 430 shown in FIG. 4 comprises a single bit flip-flop 308. Single bit flip-flop 308 sets its output, RAM access response signal 214, equal to its input, single bit flip-flop input signal 220, after the rising edge of clock signal 206. The RAM access response signal 214 provides one input to multiplexer 306. The other input to multiplexer is RAM access request signal 202. The multiplexer 306 is selected by request signal 66. When request signal 66 is high, RAM access request signal 202 is selected. When request signal 66 is low, RAM access response signal 214 is selected. Thus, handshaking circuit 430 copies the value of RAM access request signal 202 to RAM access response signal 214 when request 66 is high. Single bit flip-flop 308 also receives a clear input signal 208 for resetting the single bit flip-flop 308.

Thus, through the use of read-write circuit 420, handshaking circuit 430, and internal addressing circuit 440, RAM test control unit 60 is operable to obtain control of single port clocked RAM 70 and control the reading and writing of data to all memory locations of single port clocked RAM 70. Additionally, because data used for testing the single port clocked RAM 70 is provided and received by the parallel host bus 30, data may be written and read in parallel form. Because data may be written and read in parallel form, testing may be performed rapidly.

FIG. 5 is a timing diagram associated with a portion of the RAM test control unit 60 illustrated in FIG. 4. FIG. 5 provides example waveforms for clock signal 206, RAM test signal 212, RAM access request signal 202, request signal 66, and RAM access response signal 214.

With reference to FIGS. 1 through 5, the operation of one embodiment of the invention will be described. When it is desired to test the single port clocked RAM 70, appropriate control signals are provided though the parallel host bus 30 to RAM test control unit 60. Testing is enabled by setting RAM test signal 212 high. With RAM test signal 212 high, request signal 66 may be high when RAM access request signal 202 and RAM access response signal 214 have different values, as shown in FIG. 5. If RAM access request signal 202 and RAM access response signal 214 have different values, the RAM test control unit 60 is selected by arbiter 110 to control single port clocked RAM 70, with action from transmit FIFO control unit 40 and receive FIFO control unit 50 blocked. Toggling the value of RAM access request signal 202 changes request signal 66 from low to high as described below.

Upon startup the RAM access request signal 202 and RAM access response signal 214 are low. Additionally, after the RAM test control unit 60 has completed accessing the single port clocked RAM 70, the value of RAM access request signal 202 is copied to RAM access response signal 214. Thus, until RAM access request signal 202 is toggled, RAM access request signal 202 and RAM access response signal 214 will both have the same value. When RAM access request signal 202 and RAM access response signal 214 have the same value, or when RAM test signal 212 is low, request signal 66 will be low and RAM test control unit 60 will not have control of the single port clocked RAM 70. However, under the condition that RAM test signal 212 is high, once RAM access request 202 is toggled, the values of RAM access request signal 202 and RAM access response signal 214 will differ and the output of EXCLUSIVE-OR gate 302 will be high, setting request signal 66 high. With request signal 66 high, the RAM test control unit 60 may control reading and writing to the single port clocked RAM 70.

The addressing of data is accomplished as follows. Address output signal 62 is set to zero by setting clear address signal 210 high. With the address output signal 62 set to zero, data from the parallel host bus 30 is written by setting action signal 204 high, making read-write signal 64 low. When read-write signal 64 is low, data provided through the parallel host bus 30 may be written to single port clocked RAM 60. When read-write signal 64 is high, data may be read from single port clocked RAM 70. With address output signal 62 set to zero, data is first written to location zero.

As discussed above in conjunction with FIG. 4, when request 66 is high, incrementer 314 adds one to address output signal 62. Thus RAM access response 214 was toggled after RAM test control 60 finished writing, and address output signal 62 was incremented by one for the next write action. Upon completion of writing, the value of RAM access request 202 is copied to the value of RAM access response 214, changing request signal 66 from high to low. To write a second time, RAM access request 202 is toggled, changing request signal 66 to high to allow writing. Data is then written to location one because address output signal 62 was incremented by one. These steps may be repeated until the single port clocked RAM 70 is filled with data provided by the parallel host bus 30.

After filling the single port clocked RAM 70 with data, the data is read back though the parallel host bus 30 and compared to the expected data to verify the integrity of the single port clocked RAM 70. This procedure is accomplished as follows.

The clear address signal 210 is set high to reset address output signal 62 to zero. Action signal 204 is set low, making read-write signal 64 high to designate reading from single port clocked RAM 70. RAM access request 202 is then toggled, setting request signal 66 high and allowing reading of data at location zero. Setting request signal 66 high also increments address signal 224. Address signal 224 is copied to the address output signal 62 at output 227 after the rising edge of clock input 206. Thus, address output signal 62 is incremented by one for the next read. The data read may then be compared to the expected data to confirm the integrity of the single port clocked RAM 70. Upon completion of reading, the value of RAM access request 202 is coped to the value of RAM access response 214, changing request signal 66 from high to low. To read from the next location in memory, RAM access request 202 is toggled, changing request signal 66 to high to allow reading. Data may then be read from location one. These steps may be repeated until all data locations are checked.

The above-described process for verifying the integrity of the single port clocked RAM 70 may be repeated until all of its bits are toggled. One method for accomplishing toggling of all bits in the single port clocked RAM 70 described in FIGS. 1 through 5 comprises writing and reading three sets of data. The data that may be written comprises (1) writing the value of the address to the address location to ensure the single port clocked RAM 70 is being addressed correctly; (2) writing AAAAAAAAH to each memory location; and (3) writing 55555555H to each memory location. Because addresses associated with particular locations in single port clocked RAM 70 can be specified by test control unit 60, the value of the address may be written to the memory location specified by that address. Thus, a complete testing of the single port clocked RAM 70 may be performed.

The RAM test control unit 60 may also be used to examine the contents of the single port clocked RAM 70. Examining the contents of single port clocked RAM 70 may be useful for debugging purposes. This procedure is substantially similar to the testing of single port clocked RAM 70 described above except that, instead of writing data provided by the parallel host bus 30 and then reading it, the data temporarily stored in the single port clocked RAM 70 for transmission to either parallel host bus 30 or IEEE 1394 serial bus 20 is directly read. Reading of data from single port clocked RAM 70 is accomplished by setting RAM test 212 signal high, setting clear address signal 210 high, and setting action signal 204 low to indicate data will be read from single port clocked RAM 70. RAM access request signal 202 is then toggled, setting request signal 66 high to allow reading of data from single port clocked RAM 60. After reading from location zero, address output signal 62 is incremented and the value of RAM access request signal 202 is copied to the value of RAM access response signal 214, changing request signal 66 from high to low. In order to read data a second time, RAM access request 202 is toggled, changing request signal 66 to high. Data is then read from location one. These steps may be repeated until all data locations are read.

Thus, RAM test control unit 60 operates to allow testing of single port clocked RAM 70 by obtaining control of single port clocked RAM 70, controlling the reading and writing of data to all memory locations of single port clocked RAM 70, and internally generating addresses for specifying locations for writing or reading data provided from parallel host bus 30. Therefore a more complete and rapid test of single port clocked RAM 70 may be performed than the testing possible with conventional techniques. Additionally, according to the teachings of the invention, the contents of all memory locations within single port clocked RAM 70 may be examined.

Although the invention has been particularly shown and described by the foregoing detailed description, it will be understood by those skilled in the art that various other changes in form and detail may be made without departing from the spirit and scope of the invention, which is defined by the appended claims.

What is claimed is:

1. A parallel to serial interface for connecting a parallel host bus to an IEEE 1394 serial bus, the interface comprising:

a random access memory having a plurality of memory locations for temporarily storing data received from either the parallel host bus or the IEEE 1394 serial bus, the random access memory being logically divided into a transmit memory portion and a receive memory portion;

a transmission control unit operable to control transmission of data from the parallel host bus to the serial bus, the transmission control unit further operable to access the transmit memory portion of the random access memory;

a reception control unit operable to control reception of data by the parallel bus from the IEEE 1394 serial bus, the receive control unit further operable to access the receive memory portion of the random access memory; and a test unit operable to:
  selectively obtain control of the random access memory based on a control signal received from the parallel host bus;
  internally generate addresses for each memory location within the random access memory;
  control transmission of parallel data from each memory location associated with the internally generated addresses to the parallel host bus for inspection; and
  selectively relinquish control of the random access memory to allow transmission of data between the IEEE 1394 serial bus and the parallel host bus.

2. The interface of claim 1 wherein the test unit is further operable to control transmission of parallel data from the parallel host bus to each memory location associated with the internally generated addresses.

3. The interface of claim 1 wherein the test unit comprises a counter for generating the addresses for each memory location within the random access memory.

4. The interface of claim 3 wherein the test unit is further operable to receive a clear address signal operable to reset the counter.

5. The interface of claim 1 wherein the test unit is further operable to receive a memory access request signal operable to initiate transmission of parallel data from the random access memory to the parallel host bus.

6. The interface of claim 1 wherein:
  the transmission control unit is further operable to access the transmit memory portion of the random access memory in a first-in, first-out manner; and
  the reception control unit is further operable to access the reception memory portion of the random access memory in a first-in, first-out manner.

7. The interface of claim 1 wherein the test control unit is further operable to:
  receive a memory test signal;
  receive a memory access request signal; and
  generate a memory control signal operable to obtain control of the memory based on the values of the memory test signal and the memory access request signal.

8. A parallel to serial interface for connecting a parallel host bus to an IEEE 1394 serial bus, the interface comprising:
  a random access memory having a plurality of memory locations for temporarily storing data received from either the parallel host bus or the IEEE 1394 serial bus;
  a control unit operable to:
    control the transmission of data from the parallel host bus to the IEEE 1394 serial bus;
    control the reception of data by the parallel host bus from the IEEE 1394 serial bus; and
  a test unit operable to:
    receive a control signal from the parallel host bus;
    selectively obtain control of the random access memory based on the control signal received from the parallel host bus;
    internally generate addresses for each memory location within the random access memory;
    control transmission of parallel data from the host bus to each memory location associated with the internally generated addresses; and
    control transmission of parallel data to the host bus from each memory location associated with the internally generated addresses for comparison to parallel data transmitted from the host bus to each memory location associated with the internally generated addresses.

9. The interface of claim 8 wherein the test unit comprises a counter for generating the addresses for each memory location within the random access memory.

10. The interface of claim 9 wherein the test unit is further operable to receive a clear address signal from the parallel host bus operable to reset the counter.

11. The interface of claim 8 wherein the test unit is further operable to receive a memory access request signal from the parallel host bus operable to initiate transmission of parallel data from the random access memory to the parallel host bus.

12. The interface of claim 8 wherein the test unit is further operable to:
  receive a memory test signal;
  receive a memory access request signal; and
  generate a memory control signal operable to obtain control of the memory based on the values of the memory test signal and the memory access request signal.

13. The interface of claim 8 wherein the control unit comprises:
  a transmission control unit operable to control transmission of parallel data from the host bus to the serial bus; and
  a reception control unit operable to control reception of data by the host bus from the IEEE 1394 serial bus.

14. A method for testing a memory in an interface system coupling a parallel host bus to a serial bus, comprising the steps of:
  receiving within the interface system a test control signal from the host bus;
  selectively obtaining control of memory based on the control signal;
  receiving a plurality of parallel data values from the parallel host bus;
  generating internally within the interface a write address for each parallel data value;
  writing each parallel data value to a location in the memory associated with the write address associated with the parallel data value;
  reading each parallel data value from the memory for comparison to the parallel data value written to verify the proper operation of the memory;
  selectively relinquishing control of the memory; and
  wherein the memory is selectively accessed for testing while the interface is coupled to both the parallel host bus and the serial bus and control of the memory is selectively relinquished to allow transmission of data between the host bus and the serial bus.

15. The method of claim 14 wherein the step of generating internally within the interface a write address for each parallel data value comprises incrementing the count of a counter within the interface.

16. The method of claim 14 wherein the step of generating internally within the interface a write address for each parallel data value comprises:
  receiving within the interface a clear signal from the parallel host bus;
  clearing the count of a counter within the interface based on the clear signal;
  providing the count of the counter as a first write address;
  incrementing the counter to produce an incremented count; and providing the incremented count of the counter as second write address.

17. The method of claim 14 wherein the step of obtaining control of the memory comprises:

receiving within the interface a memory test signal;

receiving within the interface a memory access request signal; and generating within the interface a memory control signal operable to obtain control of the memory based on the values of the memory test signal and the memory access request signal.

18. The method of claim 14 wherein the step of writing each parallel data value to a location in the memory associated with the write address associated with the parallel data value comprises toggling a memory access request signal.

19. The method of claim 14 wherein the step of selectively obtaining control of the memory comprises selectively obtaining control of a single port clocked random access memory used by the interface as first-in, first-out memory.

20. The method of claim 14 and further comprising the step of generating a read-write signal for specifying whether data will be read to or written from the memory.

* * * * *